United States Patent [19]
Simizu

[11] Patent Number: 6,049,084
[45] Date of Patent: Apr. 11, 2000

[54] CHARGED-PARTICLE-BEAM OPTICAL SYSTEM

[75] Inventor: Hiroyasu Simizu, Kawasaki, Japan

[73] Assignee: Nikon Corporation, Tokyo, Japan

[21] Appl. No.: 09/049,602

[22] Filed: Mar. 27, 1998

[30] Foreign Application Priority Data

Mar. 28, 1997 [JP] Japan .................................. 9-077775

[51] Int. Cl.[7] .......................... H01J 37/153; H01J 3/20; G21K 1/08
[52] U.S. Cl. ............................. 250/396 ML; 250/396 R
[58] Field of Search ...................... 250/396 ML, 396 R, 250/398, 492.23

[56] References Cited

U.S. PATENT DOCUMENTS

| | | | |
|---|---|---|---|
| 4,544,846 | 10/1985 | Langner et al. | 250/396 ML |
| 5,757,010 | 5/1998 | Langner | 250/396 ML |
| 5,952,667 | 9/1999 | Shimizu | 250/492.2 |

*Primary Examiner*—Edward P. Westin
*Assistant Examiner*—Nikita Wells
*Attorney, Agent, or Firm*—Klarquist Sparkman Campbell Leigh & Whinston, LLP

[57] ABSTRACT

Charged-particle-beam optical systems are disclosed exhibiting reduced aberrations. Such a system comprises a symmetric magnetic doublet type projection lens system and deflectors. An imaginary Z-axis is superimposed on the optical axis with an origin at an image-crossover point. Excitation of the deflectors and lenses is controlled by a controller so that the ratio of $G_1(Z)$ to $G_2(-M \cdot Z)$ is substantially equal to the ratio of $(-M)$ to 1 (i.e., $G_1(Z):G_2(-M \cdot Z) = (-M):1$), and the deflection trajectory of the charged-particle beam intersects with the optical axis at a crossover $Z_c$, where M is the magnification of the lens system, $G_1(Z)$ is the distribution of the deflective magnetic field formed on the object side of the crossover, and $G_2(Z)$ is the distribution of the deflective magnetic field formed on the image side of the crossover.

6 Claims, 3 Drawing Sheets

Strength of the On-axis Magnetic Field

Strength of the
On-axis Magnetic Field

CHARGED-PARTICLE-BEAM OPTICAL SYSTEM

FIELD OF THE INVENTION

This invention pertains to charged-particle-beam optical systems used in charged-particle-beam apparatus. In particular, this invention pertains to charged-particle-beam optical systems that reduce deflection chromatic, deflection distortion, and deflection hybrid distortion aberrations.

BACKGROUND OF THE INVENTION

FIG. 5 is a schematic drawing of the lower portion of a conventional projection-exposure apparatus of a symmetric magnetic doublet type (SMD) configuration, that uses an electron beam and a segmented reticle (mask). In FIG. 5, the electron gun and illumination-optical system of the exposure apparatus are omitted so that only the configuration from a reticle 1 to a sensitive substrate (wafer) 5 is shown. This conventional exposure apparatus comprises a first projection lens 3 and a second projection lens 4.

By "segmented" is meant that the reticle is divided into multiple "mask subfields" that are individually exposed onto the wafer 5. The individual images of the mask subfields on the wafer, termed "transfer subfields," are positioned relative to each other such that the transfer subfields collectively "stitch together" the entire mask pattern on the wafer.

Each of the subfields 1a of the reticle 1 is uniformly illuminated by an electron beam EB having a cross-sectional profile that is similar in shape to the illuminated mask subfield 1a. The electron beam EB passing through the mask subfield 1a is focused on the wafer 5 through an aperture 6, whereby the resist in a corresponding transfer subfield on the wafer 5 is exposed to the electron beam EB. The aperture 6 is positioned at a crossover $Z_c$ on an optical axis AX. Off-axis portions EB1, EB2 of the electron beam EB pass through points 11, 12, respectively, on the mask subfield 1a. The off-axis electron-beam portions EB1, EB2 pass through the crossover $Z_c$ and converge on predetermined corresponding locations on the wafer 5.

In the FIG. 5 exposure apparatus, the projection lenses 3, 4 are sized and positioned so as to comprise an SMD lens system having a magnification of M (e.g., ½, ¼, etc.). The size of the projection lens 3 is 1/M times the size of of the projection lens 4, and the positional relationship between the projection lens 3 and the projection lens 4 is 1:M with respect to the crossover $Z_c$. In addition, the projection lenses 3, 4 each have the same AT (Ampere Turn) number, and are excited so that the directions of their respective magnetic fields formed on the optical axis AX are opposite to one another. Furthermore, the ratio of the distance between the reticle 1 and the aperture 6 to the distance between the aperture 6 and the wafer 5 is 1:M.

FIG. 6 is a graph qualitatively showing the distribution of the magnetic field along the optical axis that is induced by the projection lenses 3, 4. The vertical axis represents the strength of the magnetic field on the optical axis, and the horizontal axis represents a Z position along a Z-axis coordinate system which coincides with the optical axis AX. The Z-axis reference points $Z_0$, $Z_i$ represent the Z-axis coordinates of the reticle 1 and the wafer 5, respectively. If the crossover $Z_c$ is selected as the origin of the Z-axis coordinate system (i.e., $Z_c=0$), an SMD lens system generally satisfies the relation:

$$B_1(Z) = -M \cdot B_2(-M \cdot Z) \quad (1)$$

wherein $B_1(Z)$ is the on-axis magnetic-field distribution on the reticle side of the crossover $Z_c$, and $B_2(Z)$ is the on-axis magnetic-field distribution on the wafer side of the crossover $Z_c$.

A characteristic feature of exposure apparatus that incorporate such an SMD lens system is that the chromatic aberration and distortion in both the magnification and the rotation caused by the projection lens 3 are canceled by the chromatic aberration and distortion in magnification and rotation caused by the projection lens 4, thereby minimizing the generation of these aberrations as a whole. While the SMD lens system is effective in minimizing the foregoing chromatic aberration and distortion, it does not effectively reduce deflection chromatic, deflection distortion, and deflection hybrid distortion aberrations. As a result, even if the pattern area on the reticle 1 is divided into multiple mask subfields 1a so that each mask subfield is individually exposed by the electron beam, the field curvature in mask subfields that are positioned away from the optical axis AX will be only slightly reduced by refocusing, resulting in a blurred and/or distorted image.

SUMMARY OF THE INVENTION

In view of the shortcomings of the conventional systems, an object of the present invention is to provide charged-particle-beam optical systems that reduce deflection chromatic, deflection distortion, and deflection hybrid distortion aberrations. The invention is exemplified by multiple example embodiments that accomplish this object by including, with an electromagnetic lens system, multiple deflectors. The deflectors and the electromagnetic lenses in the electromagnetic lens system are connected to a controller that controls amounts of electrical energy applied to the electromagnetic lenses and the deflectors such that deflection chromatic, deflection distortion, and deflection hybrid distortion aberrations are effectively canceled.

A first representative embodiment of a charged-particle-beam optical system according to the invention comprises an electromagnetic lens system configured as a symmetric magnetic doublet. The system further comprises magnetic-field deflectors. The deflectors and the electromagnetic lenses of the electromagnetic lens system are connected to a controller that controls the amounts of electrical energy applied to the electromagnetic lenses and the deflectors.

The electromagnetic lens system receives a charged-particle beam and directs the charged-particle beam toward a target. The electromagnetic lens system a magnification M and is arranged on an optical axis extending along a Z-axis and including a crossover $Z_c$. The on-axis distribution of the deflective magnetic field formed on the object side of the crossover $Z_c$ is denoted $G_1(Z)$, and the on-axis distribution of the deflective magnetic field formed on the image side of the crossover $Z_c$ is denoted $G_2(Z)$.

The controller controls the excitation of the electromagnetic lenses and the deflectors such that the ratio of $G_1(Z)$ to $G_2(-M \cdot Z)$ is substantially equal to the ratio of $(-M)$ to 1 (i.e., $G_1(Z):G_2(-M \cdot Z)=(-M):1$), and the deflection trajectory of the charged-particle beam intersects the optical axis at the crossover.

In a second representative embodiment, a charged-particle-beam optical system is provided that comprises an electromagnetic lens system configured as a symmetric magnetic doublet. The system further comprises first and second magnetic-field deflectors and a controller connected to the electromagnetic lenses and the deflectors. The controller controls amounts of electrical energy applied to the electromagnetic lenses and to the deflectors. The electromagnetic lens system has a magnification M and an optical axis that includes a crossover $Z_c$.

The first deflector is situated on the object side of the crossover $Z_c$, and the second deflector is situated on the image side of the crossover $Z_c$. The distance from the crossover along the optical axis to the second deflector is preferably M times the distance from a crossover to the first deflector. The size of the second deflector is preferably M times the size of the first deflector.

The controller controls the excitation of the electromagnetic lenses and of the first and second deflectors such that: (a) the direction of the magnetic field produced by the second deflector is opposite to the direction of the magnetic field produced by the first deflector, (b) the magnitude of the magnetic field produced by the second deflector is preferably 1/M the magnitude of the magnetic field produced by the first deflector, and (c) the deflection trajectory of the charged-particle beam intersects the optical axis at a crossover point.

A charged-particle-beam optical system according to a third representative embodiment is similar to the charged-particle-beam optical system of the first representative embodiment. However, in the third representative embodiment, the number of turns of the coil of the first deflector is substantially equal to the number of turns of the coil of the second deflector. Also, an upper coil of the first deflector is connected in series to a lower coil of the second deflector, with both coils being excited by a first power source. Additionally, a lower coil of the first deflector is connected in series with an upper coil of the second deflector, with both coils being powered by a second power source.

The foregoing and additional features and advantages of the invention will be more readily apparent from the following detailed description, which proceeds with reference to the accompanying drawings.

DETAILED DESCRIPTION

This invention is described below in connection with multiple example embodiments that represent that current best mode of the invention.

EXAMPLE EMBODIMENT 1

Figure 1:
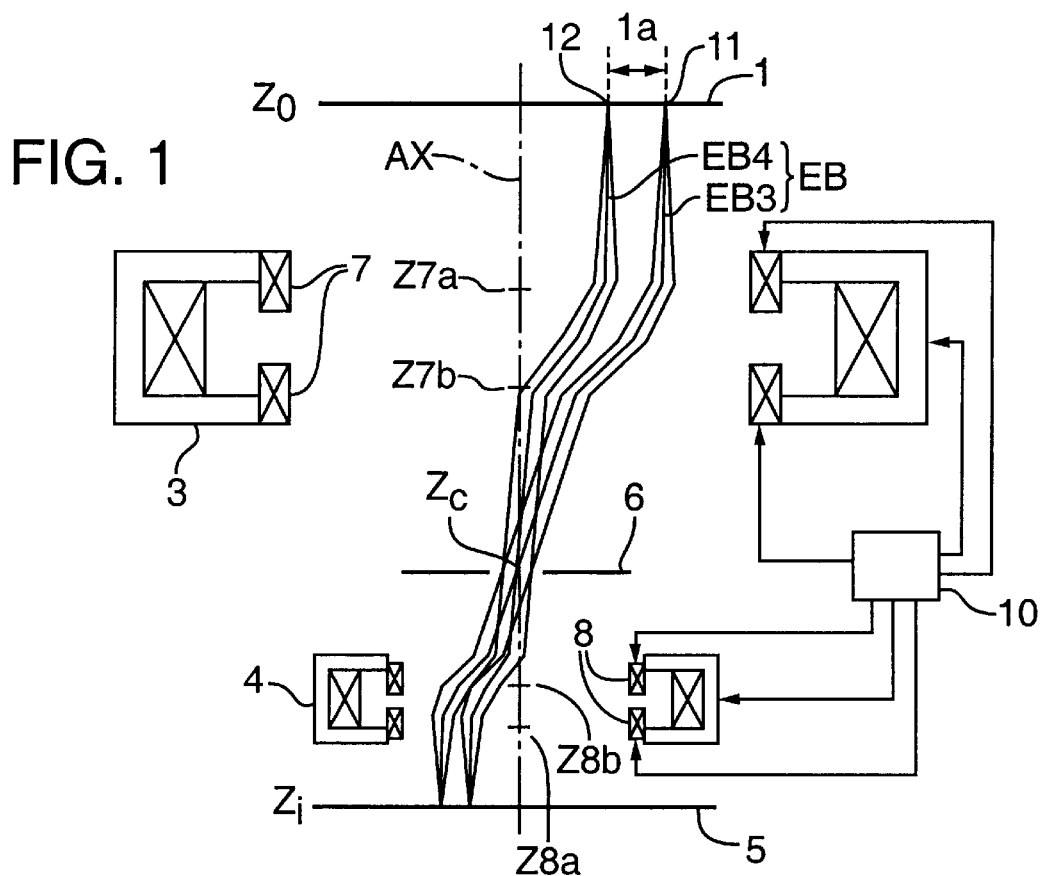
FIG. 1 is a schematic elevational view of a charged-particle-beam optical system according to a first example embodiment of the invention.
Figure 5:
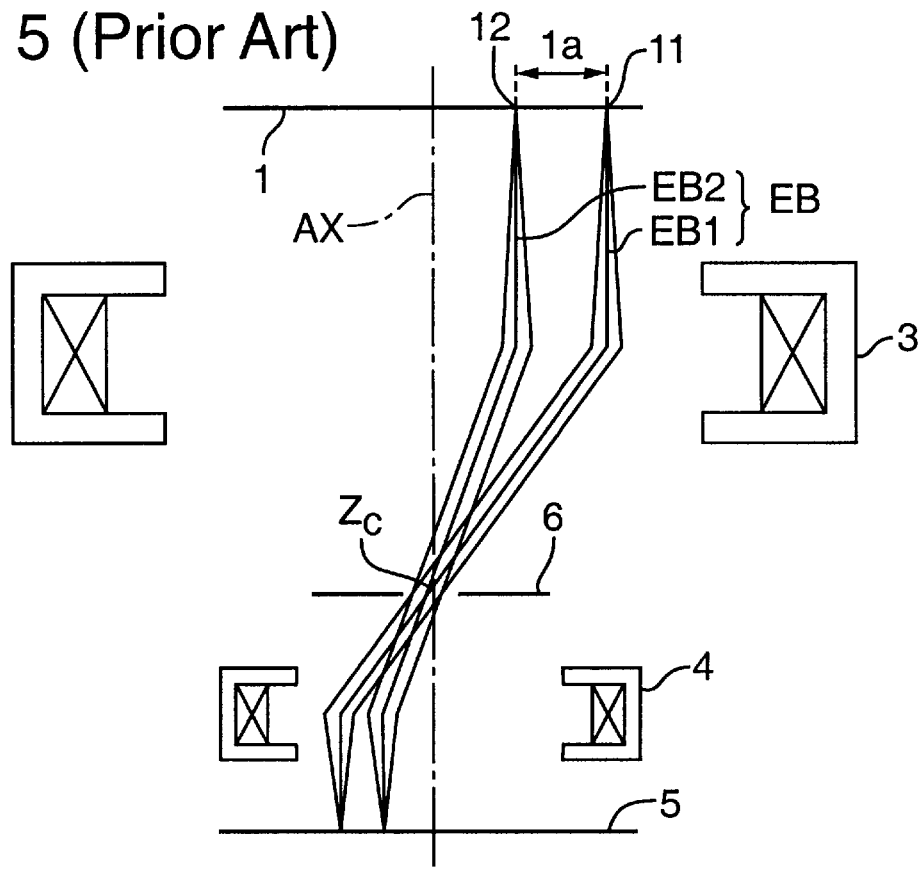
FIG. 5 is a schematic elevational view of a conventional charged-particle-beam optical system.
Figure 6:
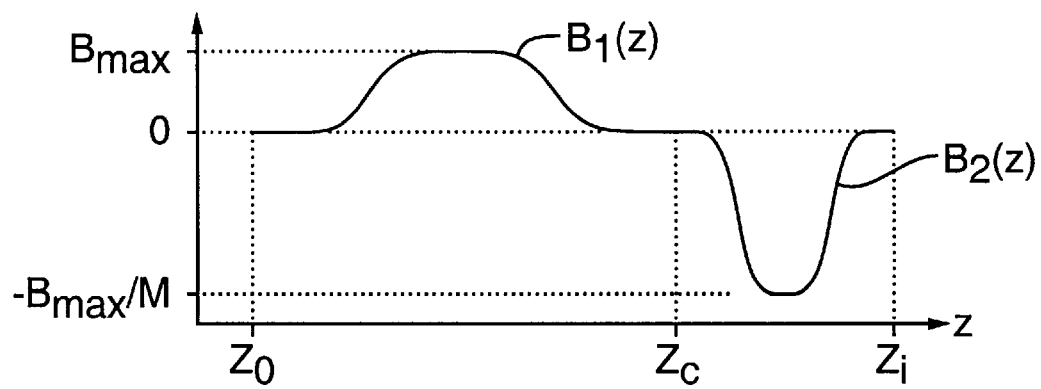
FIG. 6 is a graph qualitatively showing the on-axis distribution of the magnetic field in the FIG. 5 conventional charged-particle-beam optical system.

FIG. 1 is a schematic elevational view of a charged-particle-beam optical system according to this example embodiment. This optical system is particularly applicable to projection-exposure apparatus using an electron beam and a segmented mask. A comparison of FIG. 1 with FIG. 5 reveals that certain components have the same reference designators and are similarly placed in both figures. These include the reticle 1, the projection lenses 3, 4, the wafer 5, the aperture 6, the crossover $Z_c$, and the optical axis AX. This example embodiment, in contrast to the FIG. 5 conventional system, includes deflectors 7, 8 associated with the projection lenses 3, 4, respectively, and a controller 10 connected to the lenses 3, 4, and deflectors 7, 8. The deflectors 7, 8 add a deflection magnetic field to the magnetic fields produced by the projection lenses 3, 4, respectively. Thus, the deflection trajectory of the charged-particle beam is defined by a resultant magnetic field that is a combination of the deflection magnetic field produced by the deflectors and the magnetic field produced by the projection lenses. The excitation of the deflectors 7, 8 and the projection lenses 3, 4 is controlled by the controller 10. The projection lenses 3, 4 comprise a symmetric magnetic doublet (SMD) lens system similar to the SMD lens system of the FIG. 5 conventional system so that the on-axis focusing magnetic fields produced by these lenses satisfy equation (1), above. The SMD lens system has a magnification of M. A charged-particle-beam source (not shown, but understood to be located upstream of the reticle 1) provides a charged-particle beam to the optical system.

Figure 2:
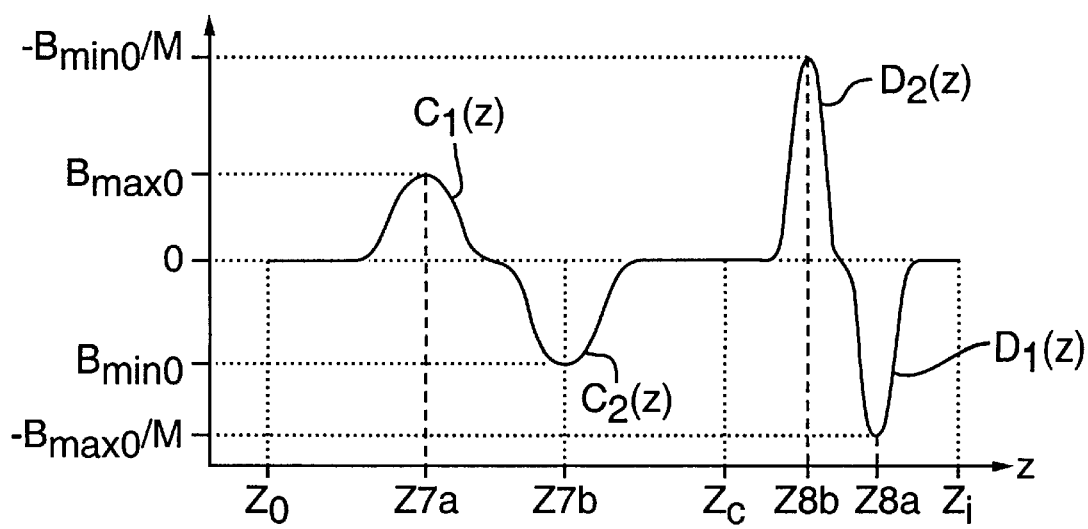
FIG. 2 is a graph qualitatively showing the on-axis distribution of the deflective magnetic field generated by the deflectors in the FIG. 1 embodiment.

FIG. 2 is a graph qualitatively showing the on-axis distribution of the deflective magnetic field generated by the deflectors 7, 8. In FIG. 2 the vertical axis represents the strength of the on-axis deflective magnetic field produced by the deflectors 7 and 8, and the horizontal axis represents a Z position along an imaginary Z-axis that is superimposed on the optical axis AX. The Z-axis constitutes a coordinate system with the crossover $Z_c$ as the origin. In this graph, the distribution profiles $C_1(Z)$ and $C_2(Z)$ are nearly symmetric about the Z-axis reference points Z7a, Z7b, both of which are located on the reticle side of the crossover $Z_c$. (The near symmetry of the distribution profiles $C_1(Z)$ and $C_2(Z)$ is preferable but not essential.) Similarly, the distribution profiles $D_1(Z)$ and $D_2(Z)$ are preferably nearly symmetric (also not essential) about the Z-axis reference points Z8a and Z8b, both of which are located on the wafer side of the crossover $Z_c$. The distribution profiles $C_1(Z)$ and $C_2(Z)$ represent the deflective field generated by the deflector 7, while the distribution profiles $D_1(Z)$ and $D_2(Z)$ represent the deflective field generated by the deflector 8. The distribution profiles $C_1(Z)$, $C_2(Z)$ have respective local peaks $B_{max0}$, $B_{min0}$. The peaks of the distribution profiles $D_1(Z)$, $D_2(Z)$ are $-(1/M)$ of the $B_{max0}$, $B_{min0}$ values, respectively expressed as $-(1/M)B_{max0}$ and $-(1/M)B_{min0}$.

The excitation of the projection lenses 3 and 4 and the excitation of the deflectors 7 and 8 are controlled by the controller 10 so that (a) the distribution profiles $C_1(Z)$, $C_2(Z)$, $D_1(Z)$, $D_2(Z)$ satisfy the following equation (2), (b) the projection lenses 3, 4 satisfy the SMD condition, and (c) the deflection trajectory of the electron beam EB intersects with the optical axis AX at the crossover $Z_c$.

$$C_1(Z):D_1(-M \cdot Z)=(-M):1 \qquad (2a)$$

$$C_2(Z):D_2(-M \cdot Z)=(-M):1 \qquad (2b)$$

The on-axis strength of the magnetic field produced by a charged-particle-beam optical system that meets the above criteria will be similar to that shown in FIG. 2. As a result, (a) chromatic aberration and distortion that appear in the magnification and the rotation of the image are canceled, and (b) the deflective chromatic aberration and distortion, resulting from errors in deflecting positions, and hybrid distortion caused by the combination of the deflection, the magnification, and the rotation, are efficiently canceled because the aberrations caused by the deflective field generated on the reticle side of the crossover $Z_c$ are canceled by the similar aberrations caused by the deflective field generated on the wafer side of the crossover $Z_c$. Accordingly, blur and distortion caused by deflection chromatic, deflection distortion, and deflection hybrid distortion aberrations are reduced, and subfield patterns that are displaced laterally from the optical axis AX can be exposed without producing the exposure-pattern errors associated with conventional systems.

The number and the positions of the deflectors are not limited to the specific deflector number and positions discussed above. A preferred number of deflectors and their respective positions can be selected as long as the following conditions are met: (a) the projection lenses 3, 4 satisfy the SMD condition; (b) the deflective field $G_1(Z)$ that is generated on the object side (i.e., the reticle side) of the crossover $Z_c$, and the deflective field $G_2(Z)$ that is generated on the image side (i.e., the wafer side) of the crossover $Z_c$, satisfy the relation:

$$G_1(Z):G_2(-M\cdot Z)=(-M):1 \quad (3)$$

wherein M is the magnification of the lens system; and (c) the deflection trajectory intersects with the optical axis at the crossover $Z_c$. The excitation of the projection lenses 3, 4 and the excitation of the deflectors 7, 8 are controlled by the controller 10 so as to satisfy these conditions.

Figure 3:
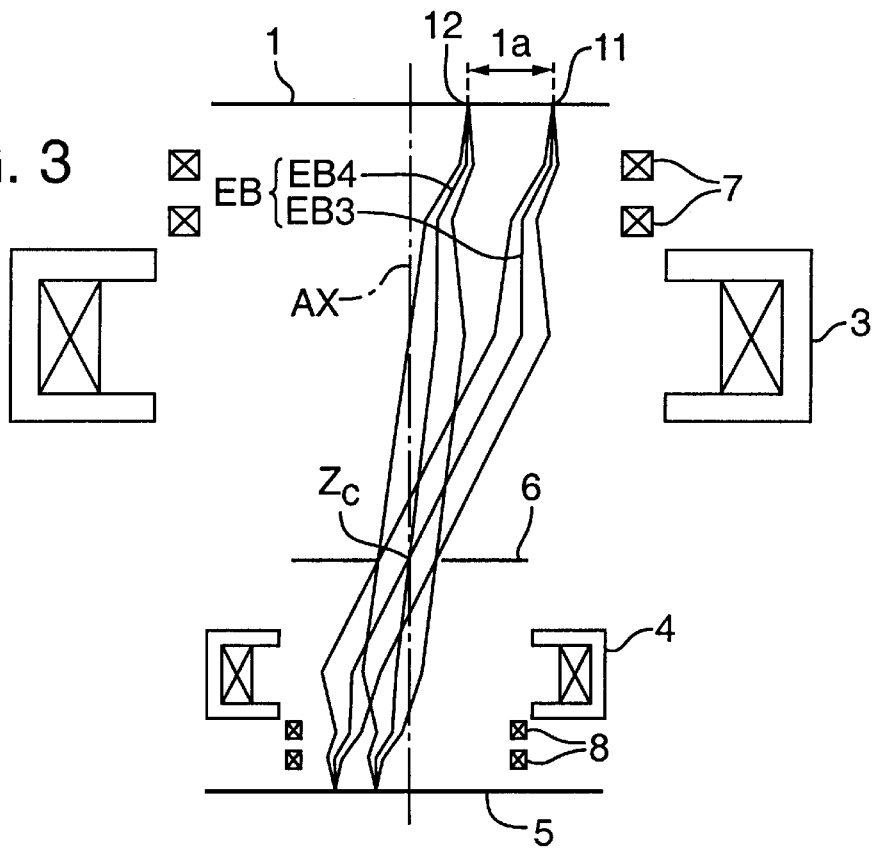
FIG. 3 is a schematic elevational view of an alternative configuration of the FIG. 1 embodiment.

An example of such an alternative configuration (absent the controller 10) is shown in FIG. 3. As shown in FIG. 3, the deflector 7 may be positioned between the reticle 1 and the projection lens 3, and the deflector 8 may be positioned between the projection lens 4 and the wafer 5. It is generally preferable for the deflectors to be positioned near the object plane and the image plane so that the curve of the deflection trajectory is reduced.

In equations (2a) and (2b), respectively, the ratio of $C_1$ to $D_1$ (i.e., $C_1:D_1$) and the ratio of $C_2$ to $D_2$ (i.e., $C_2:D_2$) are not necessarily each exactly equal to $(-M):1$. These ratios may be changed in consideration of other aberrations within the range in which the chromatic aberration in magnification and rotation, the distortion in magnification and rotation, the deflection chromatic aberration, the deflection distortion, and the deflection hybrid distortion become substantially zero.

EXAMPLE EMBODIMENT 2

Figure 4:
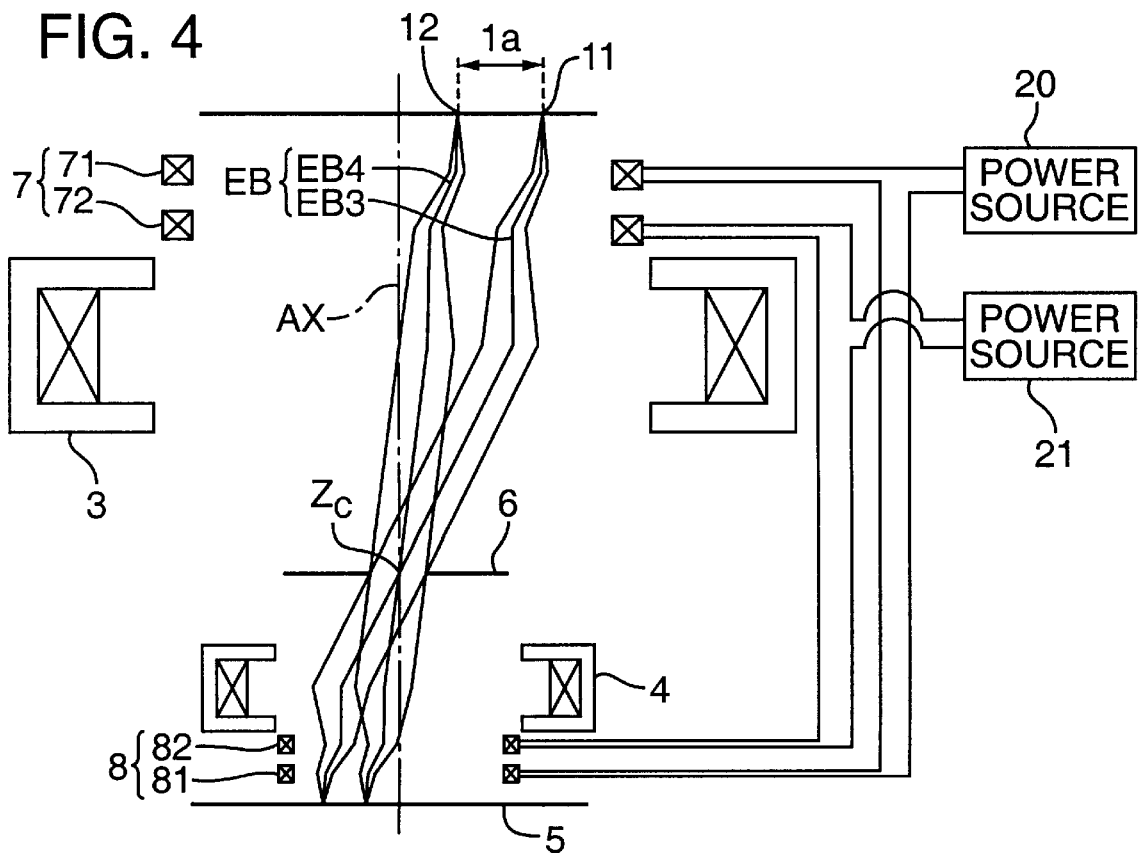
FIG. 4 is a schematic elevational view of a charged-particle-beam optical system according to a second example embodiment of the invention.

FIG. 4 illustrates a charged-particle-beam optical system according to this example embodiment of the invention. In this example embodiment, the positions and the sizes of the deflectors 7, 8 are selected so that the ratio of the distance between the deflector 7 and the crossover $Z_c$ to the distance between the crossover $Z_c$ and the deflector 8 is 1:M, and so that the ratio of the size of the deflector 7 to the size of the deflector 8 is also 1:M. Deflective fields that are symmetric with respect to the crossover $Z_c$ can be readily generated by setting the excitation current supplied to the deflectors 7, 8 to the same AT (Ampere Turn) level. In addition, it the number of turns of the coil of the deflector 7 is equal to the number of turns of the coil of the deflector 8, then the deflectors 7, 8 can be excited by a common power source. Although a controller 10 is used in this example embodiment, the controller 10 is not shown in FIG. 4.

The deflector 7 comprises a pair of deflection coils 71, 72, and the deflector 8 comprises a pair of deflection coils 81, 82. The ratio of the distance between the coil 71 and the crossover $Z_c$ to the distance between the crossover $Z_c$ and the coil 81 is the same as the ratio of the distance between the coil 72 and the crossover $Z_c$ to the distance between the crossover $Z_c$ and the coil 82, which is 1:M. The number of turns of the coil 71 is the same as that of the coil 81. Similarly, the number of turns of the coil 72 is the same as that of the coil 82. The coils 71, 81 are connected in series, and the coils 72, 82 are connected in series. In this arrangement, it is not necessary to provide a separate power source to each coil. As shown in FIG. 4, a power source 20 is used to supply electric current to the coils 71, 81, and a power source 21 is used to supply electric current to the coils 72, 82.

In an alternative configuration, the number of turns of the coil 71 may differ from that of the coil 81, and the number of turns of the coil 72 may differ from that of the coil 82. In this case, a deflection trajectory exhibiting very small aberrations is obtained through aberration calculation, and the turn numbers of the coils are selected so that the ratio of the turn numbers of the associated coils 71, 81 and the ratio of the turn numbers of the associated coils 72, 82 are equal to the excitation ratio that is used to create the calculated deflection trajectory. The associated coils 71, 81 are excited by a common power source, and the coils 72, 83 are excited by a common power source.

When using common power sources to excite associated coils, it is preferable to finely regulate the current supplied to the coils by dividing the coil resistance into small sections (not shown).

As discussed above, the present invention improves upon conventional charged-particle-beam optical systems in that: (a) the chromatic aberration and the distortion that can appear in the magnification and the rotation of the image are canceled; and (b) the deflection chromatic aberration and deflection distortion, which result from errors in deflecting positions, and the deflection hybrid distortion caused by a combination of the deflection, the magnification, and the rotation are efficiently canceled because the aberrations caused by the deflective field generated on the reticle side of the crossover $Z_c$ are canceled by the same kinds of aberrations caused by the deflective field generated on the wafer side of the crossover $Z_c$.

Accordingly, even when off-axis mask subfields (those mask subfields laterally displaced from the optical axis AX) are projected onto the wafer, blur or distortion in the resultant images can be reduced compared with images produced by conventional systems. As a result, the resolution, the stitching accuracy, and the superposition accuracy are improved. Moreover, since the deflection field can be set larger than in conventional systems, the throughput of charged-particle-beam exposure apparatus that incorporate the invention can be increased.

Whereas the present invention has been described by way of exemplary embodiments, it will be understood that the invention is not limited to those embodiments. On the contrary, the invention is intended to cover all alternatives, modifications, and equivalents as may be included within the spirit and the scope of the invention as defined by the appended claims.

What is claimed is:

1. A charged-particle-beam optical system, comprising:
   (a) an electromagnetic lens system configured as a symmetric magnetic doublet situated so as to receive a charged-particle beam and direct the charged-particle beam toward a target, the electromagnetic lens system comprising a pair of electromagnetic lenses arranged on an optical axis extending in a Z-axis direction, each electromagnetic lens being situated on a respective opposite side of a crossover on the optical axis, the electromagnetic lens system having a magnification M and producing a magnetic field;

(b) deflectors that add a deflection magnetic field to the magnetic field produced by the electromagnetic lens system so as to form an on-axis distribution of a deflective magnetic field and produce a deflection trajectory of the charged-particle beam passing through the electromagnetic lens system; and (c) a controller connected to the electromagnetic lenses and the deflectors, wherein (i) the on-axis distribution of the deflective magnetic field formed on an object side of the crossover is $G_1(Z)$, (ii) the on-axis distribution of the deflective magnetic field formed on an image side of the crossover is $G_2(Z)$, (iii) the controller controls amounts of electrical energy applied to the electromagnetic lens system and the deflectors such that $G_1(Z):G_2(-M \cdot Z)=(-M):1$, and (iv) the deflection trajectory of the charged-particle beam as effected by the electromagnetic lens system and the deflectors intersects the optical axis at the crossover.

2. A charged-particle-beam optical system, comprising:

(a) an electromagnetic lens system configured as a symmetric magnetic doublet situated so as to receive a charged-particle beam and direct the charged-particle beam toward a target, the electromagnetic lens system comprising first and second electromagnetic lenses arranged on an optical axis extending in a Z-axis direction, each electromagnetic lens being situated on a respective opposite side of a crossover on the optical axis, the electromagnetic lens system having an imaging magnification M and producing a magnetic field;

(b) a first deflector situated on an object side of the crossover;

(c) a second deflector situated on an image side of the crossover, wherein the distance along the optical axis from the crossover to the second deflector is M times the distance from the image-crossover point to the first deflector, and the size of the second deflector is M times the size of the first deflector, the deflectors adding a deflection magnetic field to the magnetic field produced by the electromagnetic lens system so as to produce a deflection trajectory of the charged-particle beam passing through the electromagnetic lens system; and (d) a controller connected to the electromagnetic lenses and the first and second deflectors, the controller serving to control amounts of electrical energy applied to the first electromagnetic lens, the second electromagnetic lens, the first deflector, and the second deflector such that the direction of a magnetic field produced by the second deflector is opposite to the direction of a magnetic field produced by the first deflector, the magnetic field produced by the second deflector having a magnitude that is 1/M times the magnitude of the magnetic field produced by the first deflector, and the deflection trajectory of the charged-particle beam as effected by the electromagnetic lens system and the first and second deflectors intersects the optical axis at the image-crossover point.

3. The charged-particle-beam optical system of claim 2, wherein the first electromagnetic lens is located on the object side of the crossover, and the second electromagnetic lens is located on the image side of the crossover, and the first deflector is situated along the optical axis at a same distance from the crossover as the first electromagnetic lens, and the second deflector is situated along the optical axis at a same distance from the crossover as the second electromagnetic lens.

4. The charged-particle-beam optical system of claim 2, wherein the first electromagnetic lens is situated on the object side of the crossover, and the second electromagnetic lens is situated on the image side of the crossover, and the first deflector is situated along the optical axis at a greater distance from the crossover than the first electromagnetic lens, and the second deflector is situated along the optical axis at a greater distance from the crossover than the second electromagnetic lens.

5. The charged-particle-beam optical system of claim 2, wherein:

the first deflector comprises a coil having a respective number of turns, and the second deflector comprises coils having a respective number of turns, the number of turns of the coil of the first deflector is substantially equal to the number of turns of the coil of the second deflector, and the coil of the first deflector is connected in series with the coil of the second deflector, with both coils being excited by a common power source.

6. The charged-particle-beam optical system of claim 2, wherein:

the first deflector comprises an upper coil and a lower coil each having a respective number of turns, and the second deflector comprises an upper coil and a lower coil each having a respective number of turns, the number of turns of the coils of the first deflector is substantially equal to the number of turns of the coils of the second deflector, the upper coil of the first deflector is connected in series with the lower coil of the second deflector, with both coils being excited by a first common power source, and the lower coil of the first deflector is connected in series with the upper coil of the second deflector, with both coils being excited by a second common power source.

* * * * *

UNITED STATES PATENT AND TRADEMARK OFFICE
CERTIFICATE OF CORRECTION

PATENT NO.    : 6,049,084
DATED         : April 11, 2000
INVENTOR(S)   : Hiroyasu Simizu Page 1 of 1

It is certified that error appears in the above-identified patent and that said Letters Patent is hereby corrected as shown below:

In Column 1, line 19, "By "segmented" is meant" should read --By "segmented" it is meant--.

In Column 1, line 41, "size of of the" should read --size of the--.

In Column 2, line 43-44, "The electromagnetic lens system a magnification M and is arranged" should read -- The electromagnetic lens system has a magnification M and is arranged--.

In Column 3, line 47, 'invention' should read --invention.--.

In Column 5, line 5, "ire"should read --are--.

In Column 6, line 22, "72, 83' should read --72,82--.

In the Claims:

In Column 8, line 6, "wherein" should read --wherein:--.

In Column 8, line 17, "wherein" should read --wherein:--.

Signed and Sealed this

Fifth Day of June, 2001

Attest:

Attesting Officer

NICHOLAS P. GODICI

Acting Director of the United States Patent and Trademark Office